US006642585B2

(12) United States Patent
Ohuchi et al.

(10) Patent No.: US 6,642,585 B2
(45) Date of Patent: *Nov. 4, 2003

(54) SEMICONDUCTOR DEVICE HAVING GATE ELECTRODE OF STACKED STRUCTURE INCLUDING POLYSILICON LAYER AND METAL LAYER AND METHOD OF MANUFACTURING THE SAME

(75) Inventors: Kazuya Ohuchi, Yokohama (JP); Atsushi Azuma, Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/414,824

(22) Filed: Oct. 8, 1999

(65) Prior Publication Data

US 2002/0030234 A1 Mar. 14, 2002

(30) Foreign Application Priority Data

Oct. 8, 1998 (JP) .............................................. 10-286505

(51) Int. Cl.$^7$ ........................ H01L 29/76; H01L 29/94; H01L 31/062; H01L 31/113; H01L 31/119
(52) U.S. Cl. ...................................... 257/388; 257/413
(58) Field of Search ................................. 257/413, 412, 257/387, 388, 346; 438/592, 303

(56) References Cited

U.S. PATENT DOCUMENTS

| 5,545,581 A | * | 8/1996 | Armacost et al. ............ 438/361 |
| 5,807,779 A | * | 9/1998 | Liaw ............................ 438/279 |
| 5,894,160 A | * | 4/1999 | Chan et al. .................. 257/412 |
| 5,985,745 A | * | 11/1999 | Kurokawa ................... 438/592 |
| 6,049,114 A | * | 4/2000 | Maiti et al. .................. 257/412 |
| 6,075,274 A | * | 6/2000 | Wu et al. ..................... 257/413 |
| 6,124,621 A | * | 9/2000 | Lin et al. ..................... 257/412 |

FOREIGN PATENT DOCUMENTS

| JP | 6-97190 | 4/1994 |
| JP | 11-26714 | 1/1999 |

* cited by examiner

Primary Examiner—Shouxiang Hu
(74) Attorney, Agent, or Firm—Pillsbury Winthrop LLP

(57) ABSTRACT

The present invention provides a semiconductor device, comprising a gate electrode of a stacked structure consisting of a polysilicon layer and a metal layer, a cap insulating film formed on the gate electrode, and a gate side wall film formed on the side wall of the gate electrode. The cap insulating film consists of an insulating film containing a silicon oxide-based layer and a silicon nitride layer and serves to protect the upper surface of the gate electrode. Further, the gate side wall film consists of an insulating film containing a silicon nitride film and a silicon oxide film and serves to protect the side surface of the gate electrode.

12 Claims, 10 Drawing Sheets

SEMICONDUCTOR DEVICE HAVING GATE ELECTRODE OF STACKED STRUCTURE INCLUDING POLYSILICON LAYER AND METAL LAYER AND METHOD OF MANUFACTURING THE SAME

BACKGROUND OF THE INVENTION

The present invention relates to a semiconductor device including a MOS field effect transistor having a gate electrode of a stacked structure including a polycrystalline silicon (polysilicon) layer and a metal layer and a method of manufacturing the same.

In recent years, a MOS field effect transistor (hereinafter referred to as MOS-FET) is being miniaturized, and the operating speed of the MOS-FET is being promoted. With increase in the operating speed, a problem of signal delay, i.e., gate delay, is generated. The gate delay depends on the product between the capacitance and the resistance of the gate wiring. In order to suppress the gate delay, used is a gate electrode of a stacked structure consisting of a polysilicon layer and a metal layer, e.g., a stacked structure consisting of a polysilicon layer and a tungsten (W) layer.

FIG. 1 is a cross sectional view showing the construction of a conventional semiconductor device having a gate electrode of a stacked structure consisting of a polysilicon layer and a tungsten layer. As shown in the drawing, a gate insulating film 101 is formed on a semiconductor substrate 100, and a gate electrode of a stacked structure consisting of a polysilicon layer 102 and a tungsten layer 103 is formed on the gate insulating film 101.

In manufacturing a semiconductor device provided with such a gate electrode, the tungsten layer 103 tends to be oxidized under an oxidizing atmosphere or tends to be dissolved in a process solution consisting of sulfuric acid and hydrogen peroxide solution. To overcome these difficulties, the gate electrode is covered with a cap film 104 and a gate side wall film 105. Each of these cap film 104 and gate side wall film 105 consists of a silicon nitride film. When it comes to the manufacturing process of the device shown in FIG. 1, a resist removing step is performed after the etching step by lithography in preparation for a wiring step with, for example, aluminum. In this resist removing step, used is a mixed solution consisting of sulfuric acid and hydrogen peroxide solution.

It should also be noted that it is important to decrease the parasitic resistance in order to achieve further miniaturization of the semiconductor device for increasing the degree of integration and to allow the semiconductor device to be operated at a high speed. In view of these requirements, used is a salicide technology that is effective for decreasing the diffusion layer resistance and the contact resistance. In the salicide technology, a metal such as titanium or cobalt is deposited on a diffusion layer, followed by applying a heat treatment so as to bring about reaction between silicon in the diffusion layer and the deposited metal, thereby forming a silicide layer in the diffusion layer.

The salicide technology includes a selective etching step for selectively removing the unreacted metal, with the silicide formed by the heat treatment left unremoved. A mixed solution consisting of sulfuric acid and hydrogen peroxide solution is used in this selective etching step.

As described above, the gate electrode of a stacked structure consisting of a polysilicon layer and a tungsten layer is treated in a subsequent step with a chemical solution containing hydrogen peroxide solution. What should be noted is that tungsten is dissolved in the particular chemical solution, making it necessary to cover the tungsten layer with an insulating film.

Tungsten is poor in its resistance to oxidation. Therefore, it is desirable for the insulating film to be formed of a material that can be deposited under a reducing atmosphere and that is capable of inhibiting intrusion of an oxidizing agent in the subsequent heating step. In general, the insulating film is formed of silicon nitride.

However, defects such as pin holes tend to be formed by stress in the silicon nitride film. Naturally, defects such as pin holes are formed in many cases in the silicon nitride film covering the gate electrode, making it difficult to prevent a mixed solution consisting of sulfuric acid and hydrogen peroxide solution from permeating through the pin holes so as to dissolve tungsten in the selective etching step with the mixed solution in the subsequent step of forming a silicide layer in the source and drain regions (diffusion layers). It should also be noted that the removing solution for removing the resist film used for the patterning intrudes through the pin holes made in the silicon nitride film used as a gate protective film (cap film and gate side wall film) so as to dissolve tungsten and, thus, to bring about breakage of the gate electrode.

Further, when a silicon nitride film acting as a cap film is deposited on the tungsten layer, tungsten is oxidized by the oxidizing agent within the atmosphere so as to bring about a morphological deterioration of the surface.

Still further, when a silicon nitride film is deposited to form a gate side wall film on the side surface of the gate electrode, an oxidizing agent within the atmosphere tends to intrude through the defects such as pin holes of the silicon nitride film so as to oxidize the tungsten layer included in the gate electrode.

BRIEF SUMMARY OF THE INVENTION

An object of the present invention, which has been achieved in an attempt to overcome the above-noted problems inherent in the prior art, is to provide a semiconductor device, in which the gate electrode of a stacked structure consisting of a polysilicon layer and a metal layer is prevented from being broken or deteriorated, and a method of manufacturing the particular semiconductor device.

According to a first aspect of the present invention, there is provided a semiconductor device, comprising a gate electrode having a stacked structure of a polysilicon layer and a metal layer, and a side wall insulating film formed on a side wall of the gate electrode for protecting the side wall of the gate electrode, the side wall insulating film having a silicon oxide layer and at least two layers of silicon nitride.

According to a second aspect of the present invention, there is provided a semiconductor device, comprising a gate electrode having a stacked structure of a polysilicon layer and a metal layer, a cap insulating film formed on a upper surface of the gate electrode for protecting the upper surface of the gate electrode, the cap insulating film having at least two layers of silicon nitride, and a side wall insulating film formed on a side wall of the gate electrode for protecting the side wall of the gate electrode, the side wall insulating film having a silicon oxide layer and at least two layers of silicon nitride.

According to a third aspect of the present invention, there is provided a method of manufacturing a semiconductor device, comprising the steps of forming a gate electrode having a stacked structure of a polysilicon layer and a metal layer on a gate insulating film formed on a semiconductor substrate, forming a side wall insulating film on a side wall of the gate electrode, the side wall insulating film having a silicon oxide layer and at least two layers of silicon nitride.

According to a fourth aspect of the present invention, there is provided a method of manufacturing a semiconductor device, comprising the steps of forming a gate electrode having a stacked structure of a polysilicon layer and a metal layer on a gate insulating film formed on a semiconductor substrate, forming a first silicon nitride film on a upper surface of the gate electrode, forming a second silicon nitride film on a side wall of the gate electrode, forming a third silicon nitride film to cover the first and second silicon nitride films, and forming a first silicon oxide film on that portion of the third silicon nitride film which is positioned on the side wall of the gate electrode.

According to a fifth aspect of the present invention, there is provided a method of manufacturing a semiconductor device, comprising the steps of forming a stacked structure forming a gate electrode and having a polysilicon layer and a metal layer on a gate insulating film formed on a semiconductor substrate, forming an insulating film including a first silicon nitride film on the stacked structure, processing the stacked structure and the insulating film to form a gate electrode, forming a second silicon nitride film on the semiconductor substrate having the gate electrode formed thereon, anisotropically etching the second silicon nitride film to allow the second nitride film to remain on a side wall of the gate electrode, forming a third silicon nitride film on the semiconductor substrate having the second silicon nitride film partly remaining thereon, forming a silicon oxide film on the third silicon nitride layer, and anisotropically etching the silicon oxide film to allow the silicon oxide film to remain on the side wall of the gate electrode.

In the semiconductor device of the present invention, the gate electrode is covered with a stacked structure having a silicon oxide layer and a silicon nitride layer. Since the silicon oxide layer prevents a chemical solution filling the defects such as pin holes of the silicon nitride film from being brought into contact with the gate electrode. As a result, the metal layer such as a tungsten layer included in the gate electrode is not dissolved in the chemical solution nor oxidized by the chemical solution.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL
VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Some embodiments of the present invention will now be described with reference to the accompanying drawings.

The construction of a semiconductor device according to a first embodiment of the present invention will be described first. The first embodiment is directed to an n-channel type MOS transistor (hereinafter referred to as nMOS transistor). However, this embodiment can also be applied to a p-channel MOS transistor (hereinafter referred to as pMOS transistor).

Figure 1:
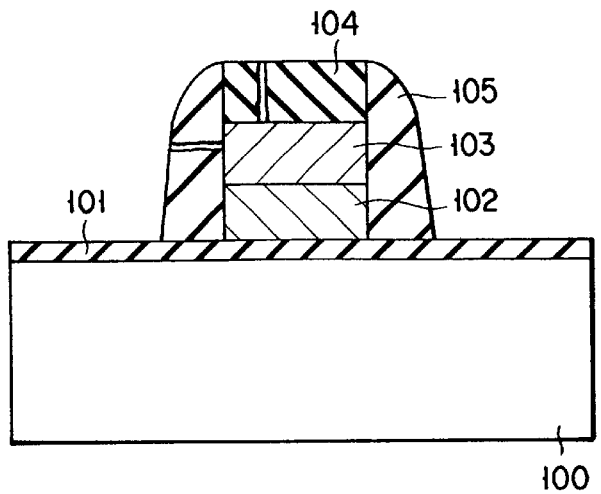
FIG. 1 is a cross sectional view showing the construction of a conventional semiconductor device.
Figure 2:
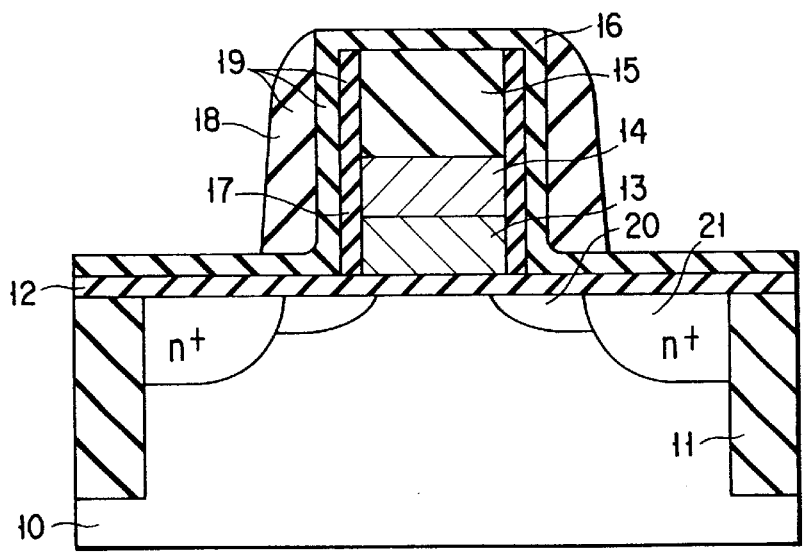
FIG. 2 is a cross sectional view showing the construction of a semiconductor device according to a first embodiment of the present invention.

FIG. 2 is a cross sectional view showing the construction of a semiconductor device according to the first embodiment of the present invention. As shown in the drawing, an element separating region 11 for separating element regions is formed in a silicon semiconductor substrate 10, and a gate insulating film 12 consisting of silicon oxide ($SiO_2$) film is formed on the element region.

A gate electrode of a stacked structure consisting of a polysilicon layer 13 having a thickness of about 100 nm and a metal film, e.g., tungsten film 14 having a thickness of about 100 nm is formed on the gate insulating film 12. A silicon nitride film 15 having a thickness of about 200 nm is formed on the gate electrode, and another silicon nitride film 16 having a thickness of about 80 nm is formed on the silicon nitride film 15. These silicon nitride films 15 and 16 collectively form a cap film acting as a gate protective film.

A silicon nitride film 17 having a thickness of about 10 nm is formed to cover side surfaces of the gate electrode and the cap film. Further, the silicon nitride film 16 having a thickness of about 80 nm covers the outer surface of the silicon nitride film 17, and a silicon oxide-based film, e.g., a silicon oxide film 18 (a BPSG(Boron-Phospho-Silicate Glass) film or a PSG (Phospho-Silicate Glass) film) is formed to cover the silicon nitride film 16. These silicon nitride films 17, 16 and silicon oxide film (or BPSG film or PSG film) 18 collectively form a gate side wall film 19 acting as a gate protective film.

An n-extension 20 and a p-extension (not shown) acting as source and drain regions are selectively formed within an nMOS and a pMOS formed in the semiconductor substrate 10. These n-extension 20 and p-extension are positioned on both edge portions of the gate electrode. Further, an $n^+$-type diffusion layer 21 and a $p^+$-type diffusion layer (not shown) are formed on the outside of the n-extension 20 and the p-extension, respectively. The semiconductor device according to the first embodiment of the present invention is constructed as described above.

Figure 3:
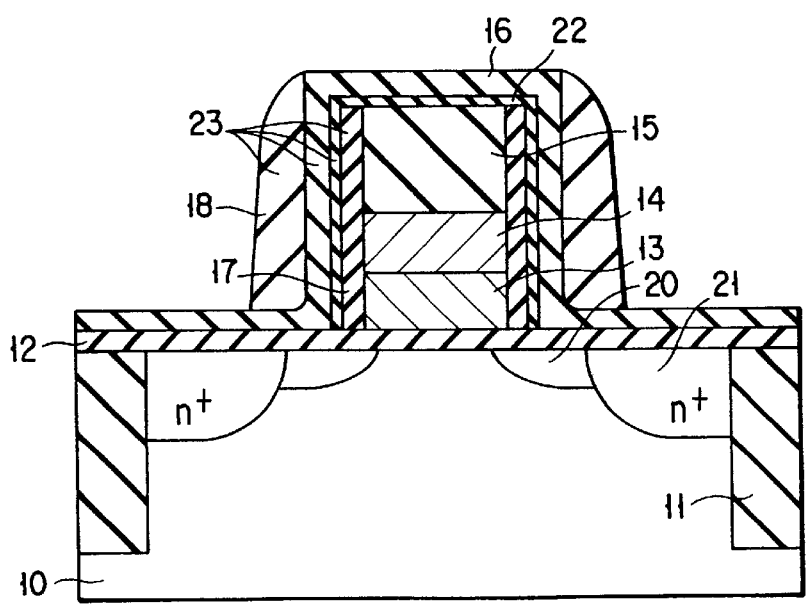
FIG. 3 is a cross sectional view showing the construction of a semiconductor device according to a modification of the first embodiment of the present invention.
Figure 4:
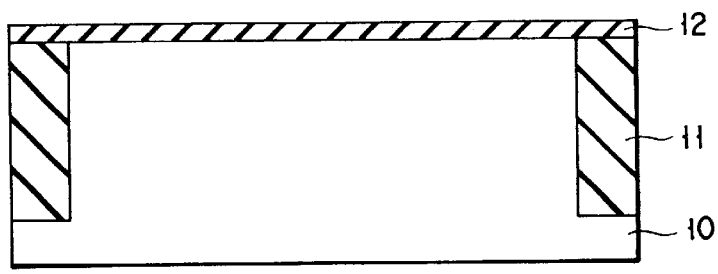
FIG. 4 is a cross sectional view showing a first step of a method of manufacturing a semiconductor device according to a first embodiment and a modification thereof of the present invention.

FIG. 3 shows a modification of the first embodiment of the present invention. In this modification, a silicon oxide-based film 22 is interposed between the silicon nitride film 15 acting as a cap film and the silicon nitride film 16. Further, a silicon oxide-based film 22 (hereinafter referred to as an oxide film) is interposed between the silicon nitride film 17 acting as a gate side wall film and the silicon nitride film 16.

The semiconductor device of the first embodiment and the modification thereof is manufactured as described in the following.

Specifically, FIGS. 4 to 14 collectively show how to manufacture the semiconductor device of the first embodiment and the modification thereof.

In the first step, the element separating region 11 is formed in the silicon semiconductor substrate 10 by a burying oxidizing method, followed by performing ion implantation for forming a well, a channel, etc. Then, a thermal oxidation is applied to the semiconductor substrate 10 under an oxidizing atmosphere of a high temperature so as to form the gate insulating film 12 consisting of silicon oxide on the semiconductor substrate 10.

Figure 5:
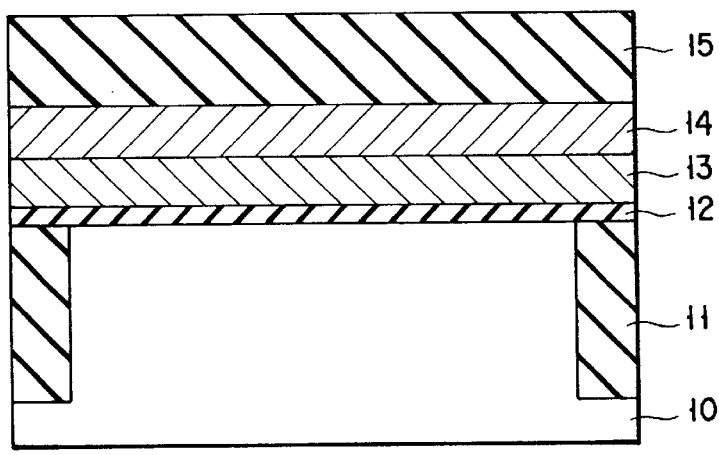
FIG. 5 is a cross sectional view showing a second step of a method of manufacturing a semiconductor device according to a first embodiment and a modification thereof of the present invention.

In the next step, a polysilicon layer 13 having a thickness of 100 nm and constituting the lowermost layer of a gate electrode having a stacked structure is formed by a CVD method on the gate insulating film 12, as shown in FIG. 5. Then, the polysilicon layer 13 is doped with, for example, phosphorus (P) by an ion implantation method at a dose of $5 \times 10^{15}$ $cm^{-2}$ and under an accelerating energy of 10 keV, followed by an annealing treatment at 850° C. for 30 minutes so as to diffuse the implanted phosphorus ions into the polysilicon layer 13. In this step, it is possible to selectively introduce, for example, phosphorus ions into the nMOS transistor-forming region and boron ions into the pMOS transistor-forming region using masks formed by lithography method.

Figure 6:
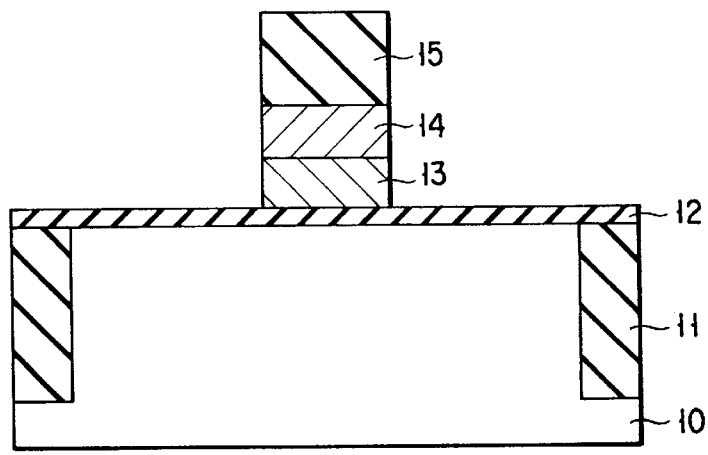
FIG. 6 is a cross sectional view showing a third step of a method of manufacturing a semiconductor device according to a first embodiment and a modification thereof of the present invention.

Then, a metal layer, e.g., a tungsten layer 14, is deposited in a thickness of 100 nm by a sputtering method on the polysilicon layer 13. Further, a silicon nitride film 15 acting as a cap film of the gate electrode is deposited in a thickness of 200 nm by a CVD method to form a stacked structure consisting of the polysilicon layer 13, the tungsten layer 14 and the silicon nitride layer 15. The stacked structure is patterned by a lithography method to form a gate electrode, as shown in FIG. 6. After formation of the gate electrode, the polysilicon layer 13 is selectively oxidized under an atmosphere containing water vapor and hydrogen.

Figure 7:
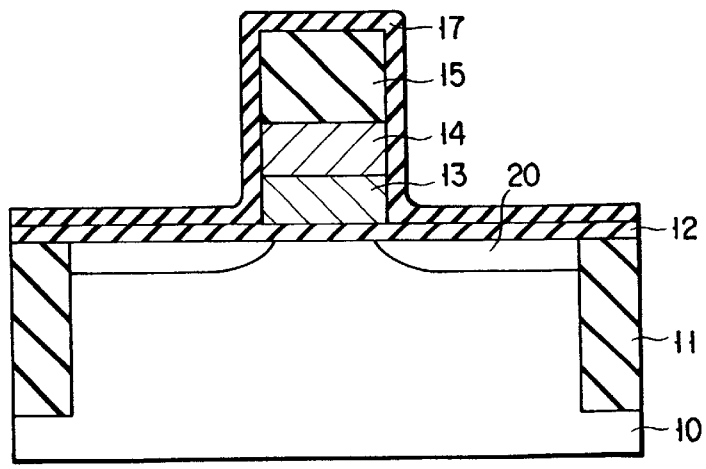
FIG. 7 is a cross sectional view showing a fourth step of a method of manufacturing a semiconductor device according to a first embodiment and a modification thereof of the present invention.

Further, the silicon nitride film 17 is deposited by a CVD method in a thickness of 10 nm to cover the side surfaces of the gate electrode, the silicon nitride film 15 acting as a cap film, and the semiconductor substrate 10, as shown in FIG. 7. Then, the n-extension 20 and the p-extension (not shown), which form source and drain regions, are formed by selective ion implantation into the nMOS transistor-forming region and the pMOS transistor-forming region, respectively, using masks formed by lithography method. In this embodiment, the n-extension 20 and the p-extension were formed after deposition of the silicon nitride film 17. Alternatively, it is possible to form first the n-extension 20 and the p-extension, followed by depositing the silicon nitride film 17.

Figure 8:
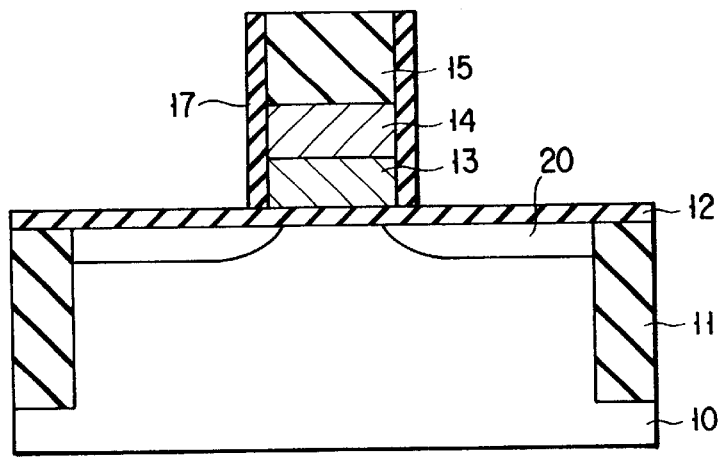
FIG. 8 is a cross sectional view showing a fifth step of a method of manufacturing a semiconductor device according to a first embodiment and a modification thereof of the present invention.

In the next step, the silicon nitride film 17 is anisotropically etched by a reactive ion etching (RIE) method without using a mask pattern of a resist film to permit the silicon nitride film 17 to be left unremoved on the side surfaces of the gate electrode, as shown in FIG. 8. In the method of manufacturing a semiconductor device according to the first embodiment of the present invention, the anisotropic etching is performed under the conditions that a silicon oxide-based film is not formed on the side surfaces of the gate electrode and on the silicon nitride film 17 and the cap film (silicon nitride film) 15. On the other hand, in the modification of the first embodiment, the anisotropic etching is performed under the conditions that the oxide film 22 (see FIG. 3) is formed in a thickness of about 1 nm on the silicon nitride film 17 positioned on the side surface of the gate electrode and on the cap film 17.

Figure 9:
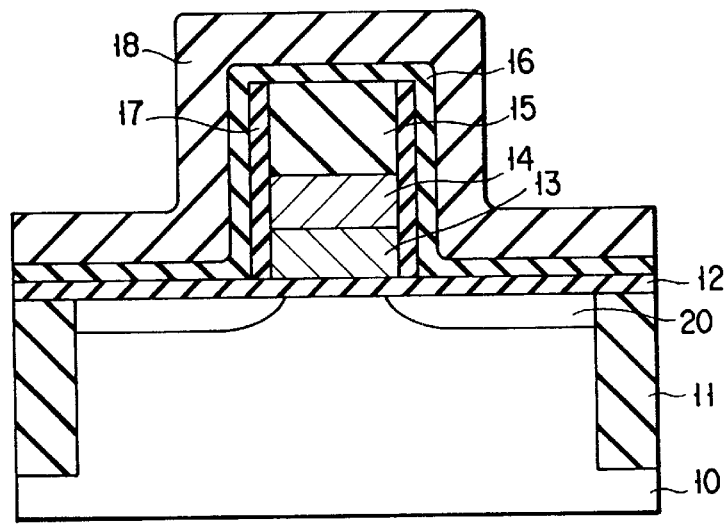
FIG. 9 is a cross sectional view showing a sixth step of a method of manufacturing a semiconductor device according to a first embodiment and a modification thereof of the present invention.

Further, the silicon nitride film 16 is deposited by a CVD method in a thickness of 80 nm on the silicon nitride film 17 positioned on the side surface of the gate electrode, the silicon nitride film 15 on the cap film and on the semiconductor substrate 10, as shown in FIG. 9. Still further, the silicon oxide film 18 (or the BPSG film or PSG film) is deposited on the silicon nitride film 16.

Then, the silicon oxide film 18 is anisotropically etched as shown FIG. 2. As a result, formed is the gate side wall film 19 consisting of the silicon nitride films 17, 16 and the silicon oxide film 18. Further, the $n^+$-type diffusion layer 21 and the $p^+$-type diffusion layer (not shown) forming source and drain regions are selectively formed in the nMOS transistor-forming region and the pMOS transistor forming region, respectively, by ion implantation, using masks prepared by lithography method. As a result, prepared is the gate electrode portion characterizing the first embodiment of the present invention.

On the other hand, in the modification of the first embodiment, the oxide film 22 having a thickness of about 1 nm is formed to cover the gate electrode, followed by depositing the silicon nitride film 16 in a thickness of about 80 nm on the oxide film 22 and subsequently depositing the silicon oxide film (or BPSG film or PSG film) 18 on the silicon nitride film 16 as in the first embodiment of the present invention.

Then, as shown in FIG. 3, the silicon oxide film 18 is anisotropically etched to form the gate side wall film 23 consisting of the silicon nitride film 17, the oxide film 22, the silicon nitride film 16 and the silicon oxide film 18. Further, the $n^+$-type diffusion layer 21 and the $p^+$-type diffusion layer (not shown) forming source and drain regions are selectively formed in the nMOS transistor-forming region and the pMOS transistor forming region, respectively, by ion implantation, using masks prepared by lithography method.

In the subsequent steps, the ordinary manufacturing process of MOS-FET is employed for manufacturing the semiconductor devices of the first embodiment and the modification thereof.

Figure 10:
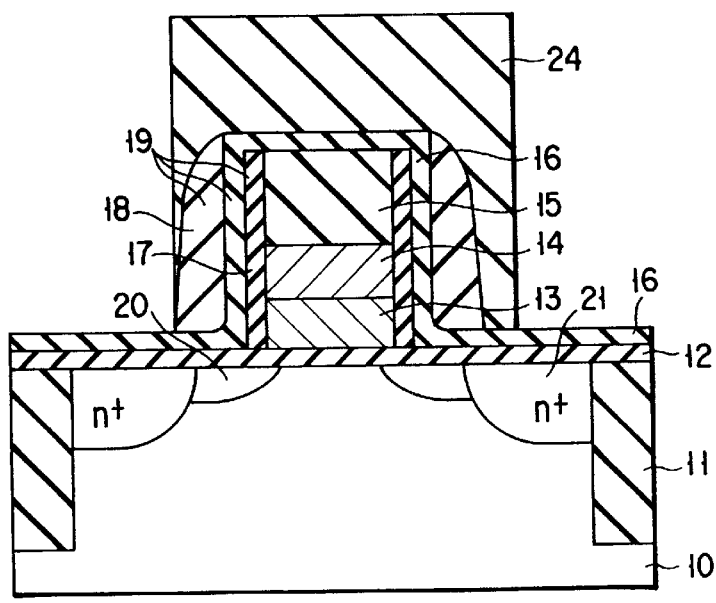
FIG. 10 is a cross sectional view showing a seventh step of a method of manufacturing a semiconductor device according to a first embodiment and a modification thereof of the present invention.
Figure 11:
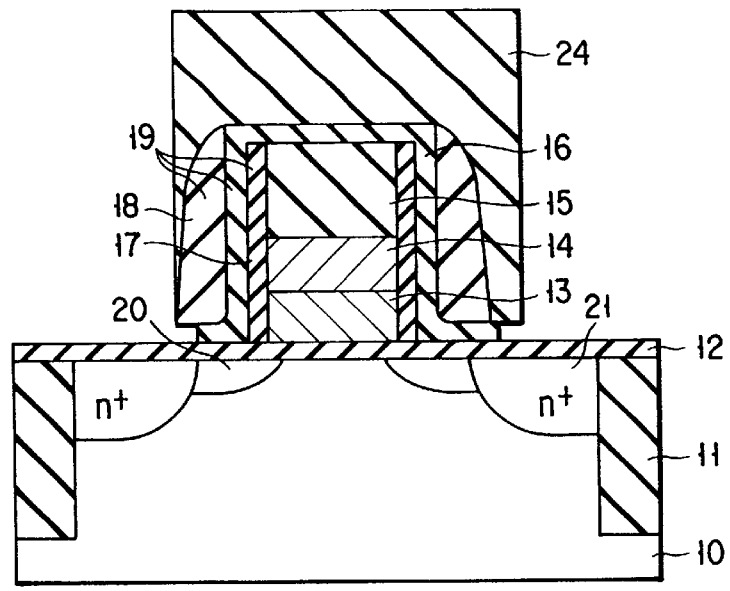
FIG. 11 is a cross sectional view showing an eighth step of a method of manufacturing a semiconductor device according to a first embodiment and a modification thereof of the present invention.
Figure 12:
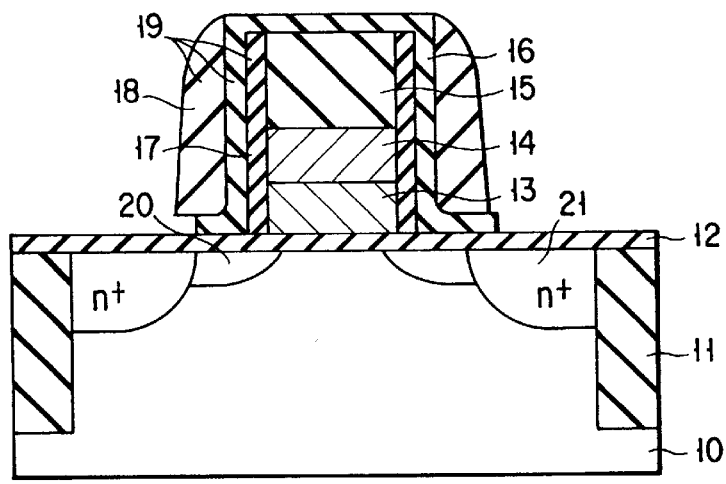
FIG. 12 is a cross sectional view showing a ninth step of a method of manufacturing a semiconductor device according to a first embodiment and a modification thereof of the present invention.
Figure 13:
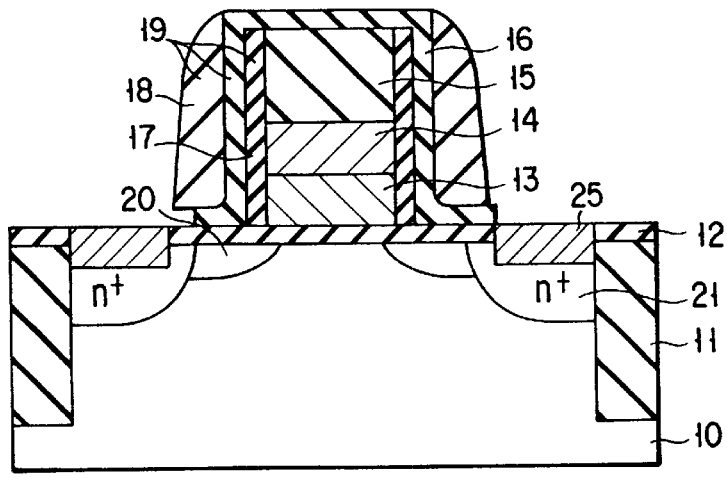
FIG. 13 is a cross sectional view showing a tenth step of a method of manufacturing a semiconductor device according to a first embodiment and a modification thereof of the present invention.

For example, the subsequent manufacturing process in the first embodiment of the present invention is as follows. In the first step, a resist pattern 24 is selectively formed on the gate electrode alone, as shown in FIG. 10, followed by etching the silicon nitride film 16 positioned on the gate insulating film 12 except the region around the gate electrode, as shown in FIG. 11. Further, the resist pattern 12 is removed, as shown in FIG. 12.

In the next step, the gate insulating film 12 positioned on the $n^+$-type diffusion layer 21 is removed by treatment with a dilute hydrofluoric acid, followed by depositing a titanium layer in a thickness of 20 nm and, then a titanium nitride layer in a thickness of 70 nm and subsequently applying a lamp annealing at 650° C. for 30 seconds under a nitrogen gas atmosphere. As a result, reaction is carried out between the $n^+$-type diffusion layer 21 and titanium to form a titanium silicide film. Then, the unreacted titanium and titanium nitride are selectively removed by the treatment with a mixed solution consisting of sulfuric acid and hydrogen peroxide solution. Further, a change in the phase of the titanium silicide layer is brought about by a lamp annealing at 800° C. for 30 seconds so as to form a C54 phase 25 having a low resistivity, as shown FIG. 13.

After formation of the C54 phase layer 25, an interlayer insulating film such as a BPSG film is deposited in a thickness of 700 nm, followed by forming a contact hole in the interlayer insulating film. Further, a conductive film is deposited on the resultant structure, followed by patterning the conductive film to form a wiring layer.

Figure 14:
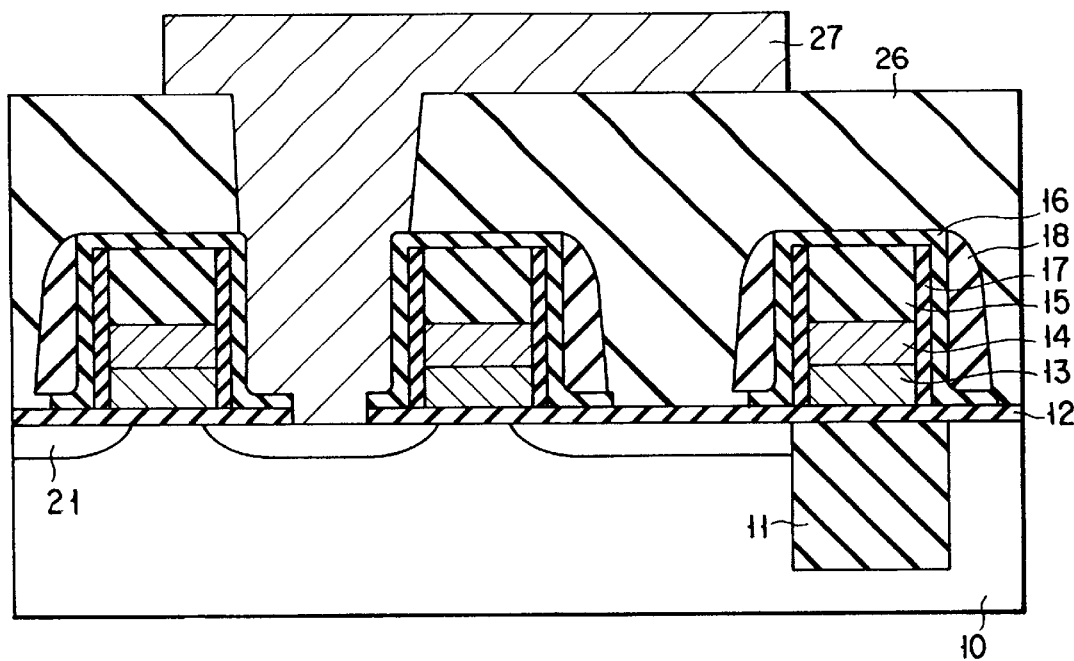
FIG. 14 is a cross sectional view showing an eleventh step of a method of manufacturing a semiconductor device according to a first embodiment of the present invention.

FIG. 14 is a cross sectional view showing a semiconductor device prepared by forming the contact hole noted above by self-alignment, followed by forming the wiring layer noted above. It should be noted that and an extension and a silicide film are not formed in the semiconductor device shown in FIG. 14. The BPSG film 26 covering the two gate electrodes is removed in forming the contact hole so as to expose the $n^+$-type diffusion layer 21 to the outside. Then, a conductive film such as a metal film is deposited on the resultant structure including the inner space of the contact hole. Further, the conductive film is patterned to form a wiring 27 connected to the $n^+$-type diffusion layer 21.

The semiconductor device of the first embodiment can be manufactured by another method. Specifically, FIGS. 15 to 19 collectively show another method of manufacturing the semiconductor device according to the first embodiment of the present invention.

Figure 15:
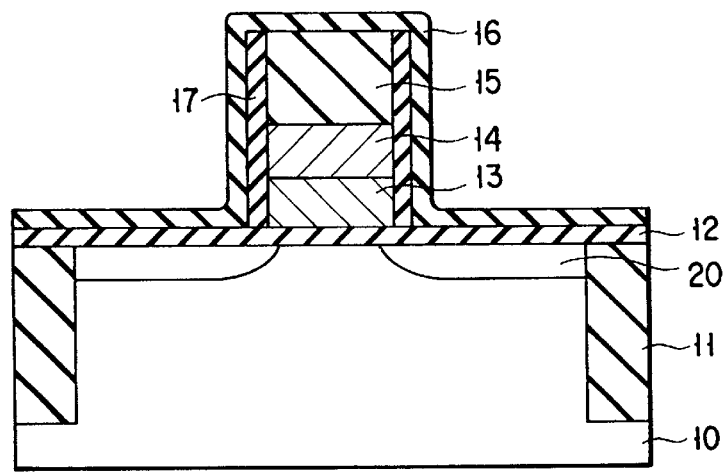
FIG. 15 is a cross sectional view showing a first step of another method of manufacturing a semiconductor device according to a first embodiment of the present invention.

A structure similar to that shown in FIG. 8 is obtained in the first step. Specifically, a stacked structure formed on the gate insulating film 12 on the silicon semiconductor substrate 10 and consisting of the polysilicon layer 13, the tungsten layer 14 and the silicon nitride layer 15 is processed to form the gate electrode, followed by forming the n-extension 20 for the source and drain regions and subsequently forming the thin silicon nitride film 17 having a thickness of about 20 nm. Then, the silicon nitride film 17 is anisotropically etched to form the silicon nitride film covering the side surface of the gate electrode, thereby obtaining a structure similar to that shown in FIG. 8. Further, the silicon nitride film 16 having a thickness of 150 nm is formed to cover the n-extension 20 and the gate electrode, as shown in FIG. 15.

Figure 16:
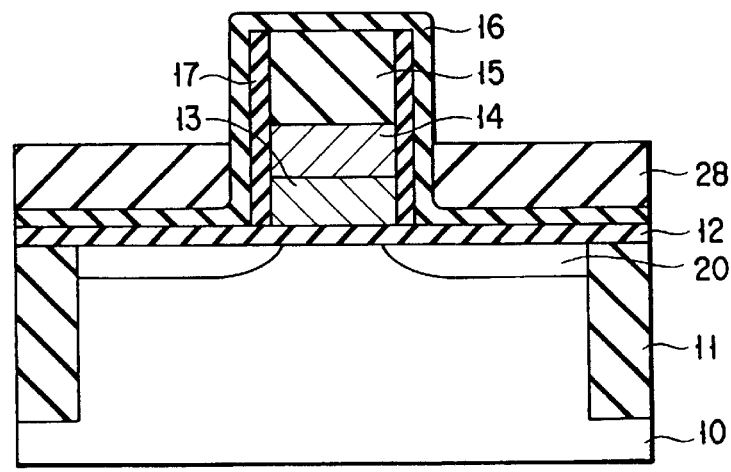
FIG. 16 is a cross sectional view showing a second step of another method of manufacturing a semiconductor device according to a first embodiment of the present invention.

In the next step, the resultant structure is coated with the resist 28, followed by etch back such that more than half the gate electrode projects from the resist 28 and the n-extensions 20 in the source and drain regions are covered with the resist 28, as shown in FIG. 16.

Figure 17:
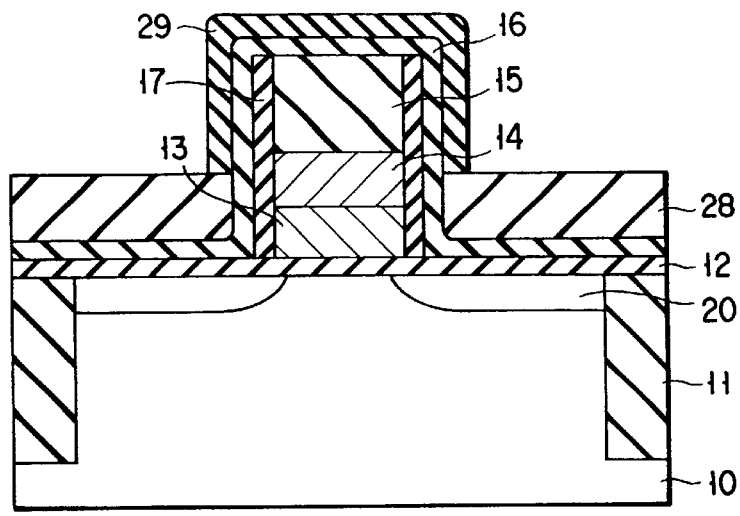
FIG. 17 is a cross sectional view showing a third step of another method of manufacturing a semiconductor device according to a first embodiment of the present invention.
Figure 18:
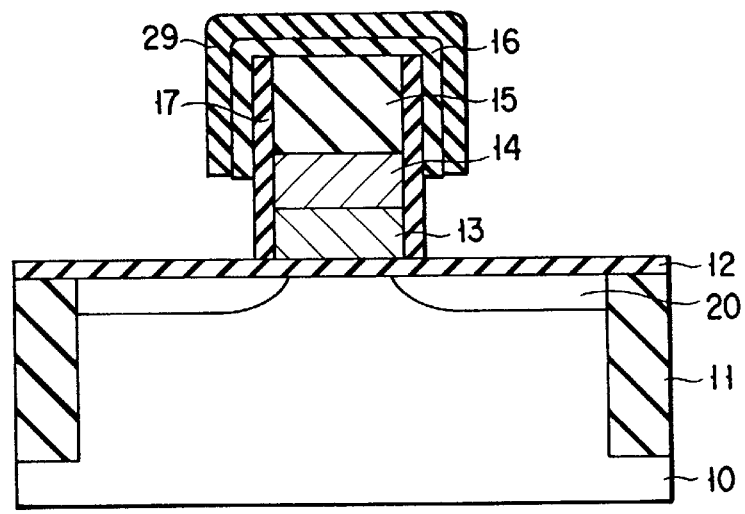
FIG. 18 is a cross sectional view showing a fourth step of another method of manufacturing a semiconductor device according to a first embodiment of the present invention.

Then, a silicon oxide film 29 is deposited by a liquid phase selective crystal growth on that portion of the gate electrode which is not covered with the resist 28, as shown in FIG. 17. Also, the resist 28 is removed by an asher to selectively expose the silicon nitride film 16 to the outside, followed by isotropically etching the exposed portion of the silicon nitride film 16 with CDE or hot phosphoric acid. As a result, the silicon nitride film 15 forming the cap film and the silicon nitride film 17 forming a gate side wall film are covered with a seamless silicon nitride film 16. Incidentally, an anisotropic etching can also be employed in place of the isotropic etching employed for etching the silicon nitride film 16.

Figure 19:
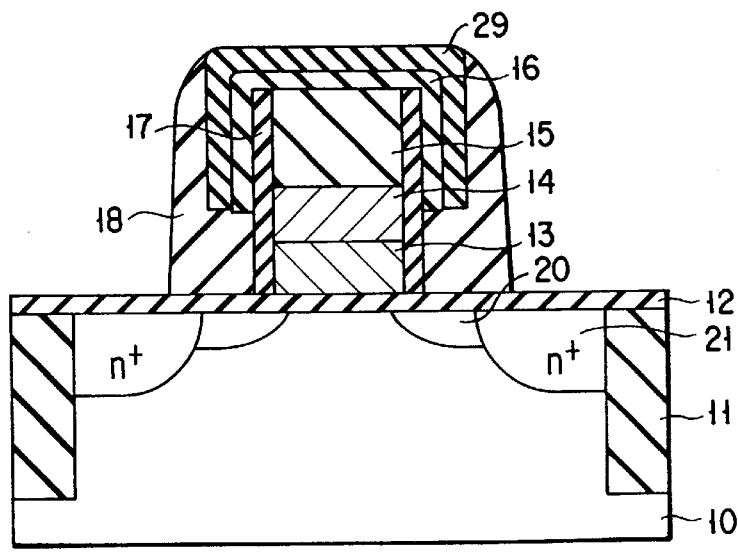
FIG. 19 is a cross sectional view showing a fifth step of another method of manufacturing a semiconductor device according to a first embodiment of the present invention.

In the next step, the silicon oxide film (or BPSG film or PSG film) 18 is deposited in a thickness of 60 nm on the resultant structure by a CVD method, followed by etching back the silicon oxide film 18 by an anisotropic etching to form the gate side wall film, as shown in FIG. 19.

Further, arsenic (As) is introduced into the nMOS transistor region by means of ion implantation under an accelerating energy of 45 keV and at a dose of $5\times10^{15}$ cm$^{-2}$. Also, $BF_2^+$ is introduced into the pMOS transistor region by means of ion implantation under an accelerating energy of 35 keV and at a dose of $3.5\times10^{15}$ cm$^{-2}$. Further, a heat treatment is applied at 950° C. for 10 seconds to form n$^+$-type diffusion layers 21 forming the source and drain regions, as shown in FIG. 19. Still further, a silicide film is formed on the n$^+$-type diffusion layers 21 by using a salicide technology, followed by depositing an interlayer insulating film such as the BPSG film 26 and subsequently forming the wiring layer 27, as in the method shown in FIGS. 13 and 14.

In the manufacturing method described above, one lithography step can be omitted, compared with the manufacturing method shown in FIGS. 4 to 14.

In the first embodiment described above, the tungsten layer 14 included in the gate electrode is covered with the silicon oxide film 18 constituting the gate side wall film. Therefore, even if defects such as pin holes are present in the silicon nitride films 16 and 17 constituting the other gate side wall films, the mixed solution of sulfuric acid and hydrogen peroxide solution used in the step of, for example, selectively removing the unreacted titanium and titanium nitride is prevented by the silicon oxide film 18 from intruding into the gate electrode. Naturally, the tungsten layer 14 is not dissolved in the mixed solution noted above.

In the modification of the first embodiment described above, the tungsten layer 14 included in the gate electrode is covered with the silicon oxide films 18 and 22 forming the gate side wall films. Therefore, even if defects such as pin holes are present in the silicon nitride films 16 and 17 constituting the other gate side wall films, the mixed solution of sulfuric acid and hydrogen peroxide solution used in the step of, for example, selectively removing the unreacted titanium and titanium nitride is prevented by the silicon oxide films 18 and 22 from intruding into the gate electrode. Naturally, the tungsten layer 14 is not dissolved in the mixed solution noted above. Further, the tungsten layer 14 is covered with the silicon oxide film 22 used as a cap film. Therefore, even if defects such as pin holes are present in the silicon nitride films 15 and 16, the mixed solution consisting of sulfuric acid and hydrogen peroxide solution is prevented by the silicon oxide film 22 from intruding into the gate electrode. Naturally, the tungsten layer 14 is not dissolved in the particular mixed solution.

It should also be noted that, in the step of forming a contact hole by self-alignment, the silicon nitride film 16 acting as a gate protective film (cap film) is formed on the gate electrode. Since the silicon nitride film 16 acts as an etching stopper on the gate electrode, the gate electrode is prevented from being corroded.

The silicon nitride film 15 can be formed by a single depositing operation. Alternatively, it is possible to repeat several times the silicon nitride deposition and interruption of the deposition such that the nitride film 15 is formed by several times of the silicon nitride deposition. In this case, even if pin holes are formed in the silicon nitride layer deposited in the previous depositing operation, these pin holes are closed by the silicon nitride layer deposited in the subsequent depositing operation. It follows that it is possible to prevent the pin holes from extending throughout the silicon nitride film 15 in its thickness direction. It is also possible to form each of the silicon nitride films 16 and 17 by several times of the silicon nitride deposition. In this case, the mixed solution consisting of sulfuric acid and a hydrogen peroxide solution is prevented from permeating through the silicon nitride film 15, 16 or 17 to reach the gate electrode.

As described above, according to the first embodiment of the present invention, a mixed solution consisting of sulfuric acid and hydrogen peroxide solution is prevented from intruding through defects such as pin holes present in the silicon nitride film acting as a gate protective film (cap film and gate side wall film) into the tungsten layer included in the gate electrode in the selective etching step with the particular mixed solution for forming silicide layers in the source and drain regions (salicide technology). As a result, the tungsten layer included in the gate electrode is prevented from being dissolved in the particular mixed solution. Also, the removing solution for removing the resist used in the patterning step is prevented from intruding through defects such as pin holes of the silicon nitride film forming the gate protective film (cap film and gate side wall film) into the tungsten layer included in the gate electrode in the resist removing step. Naturally, the tungsten layer included in the gate electrode is prevented from being dissolved in the removing solution.

Incidentally, in the first embodiment and the modification thereof described above, the gate electrode is of a stacked structure consisting of a polysilicon layer and a tungsten layer. However, the gate electrode is not limited to the particular stacked structure. For example, it is possible for the stacked structure to consist of a polysilicon layer and another metal layer.

The semiconductor devices of the second and third embodiments of the present invention will now be described. The second and third embodiments produce additional prominent effects besides the effects produced by the first embodiment.

The construction of the semiconductor device according to the second embodiment of the present invention will be described first. In the following description, the technical idea according to the second embodiment of the present invention is applied to an n-channel MOS transistor (nMOS transistor). However, the particular technical idea can also be applied to a CMOS transistor including an p-channel MOS transistor (pMOS transistor).

Figure 20:
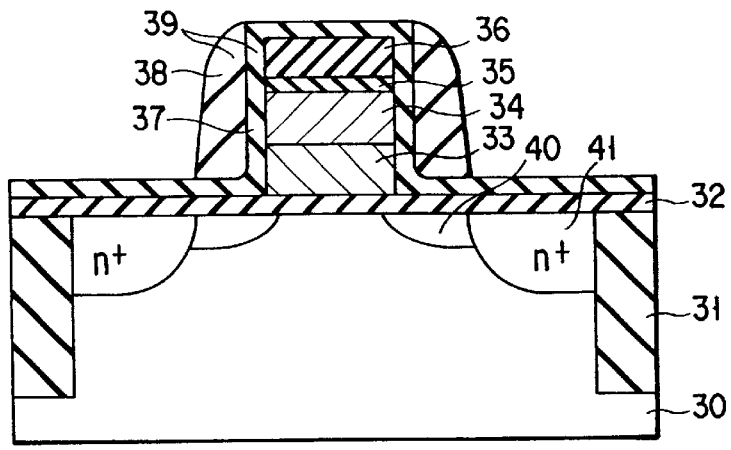
FIG. 20 is a cross sectional view showing the construction of a semiconductor device according to a second embodiment of the present invention.

FIG. 20 is a cross sectional view showing the construction of a semiconductor device according to the second embodiment of the present invention. As shown in the drawing, an element separation region 31 is formed on a semiconductor substrate 30, and a gate insulating film 32 consisting of a silicon oxide ($SiO_2$) film is formed on the element region.

A gate electrode of a stacked structure consisting of a polysilicon layer 33 and a metal film, e.g., a tungsten film 34, is formed on the gate insulating film 32 on the element region. Further, a cap film of a stacked structure acting as a gate protective film is formed on the gate electrode. The cap film consists of a silicon oxide film 35 having a thickness of about 10 to 50 nm, a silicon nitride film 36 formed on the silicon oxide film 35, and a silicon oxide film 37 having a thickness of about 10 to 20 nm and formed on the silicon nitride layer 36.

The silicon oxide film 37 having a thickness of about 10 to 20 nm extends to cover the side surfaces of the gate electrode and the cap film. Further, a silicon nitride film 38 is formed to cover the side surfaces of the silicon oxide film 37. These silicon oxide film 37 and the silicon nitride film 38 collectively form a gate side wall film 39 acting as a gate protective film.

An n-extension 40 and a p-extension (not shown) for the source and drain regions are selectively formed in the nMOS transistor and the pMOS transistor within the semiconductor substrate 30 on both edge portions of the gate electrode. Further, an n$^+$-type diffusion layer 41 and a p$^+$-type diffusion layer (not shown) are formed on the outside of the n-extension 40 and the p-extension so as to form a semiconductor device of the second embodiment.

The semiconductor device of the second embodiment is manufactured as follows. Specifically, FIGS. 20 to 25 are cross sectional views collectively the method of manufacturing the semiconductor device of the second embodiment.

Figure 21:
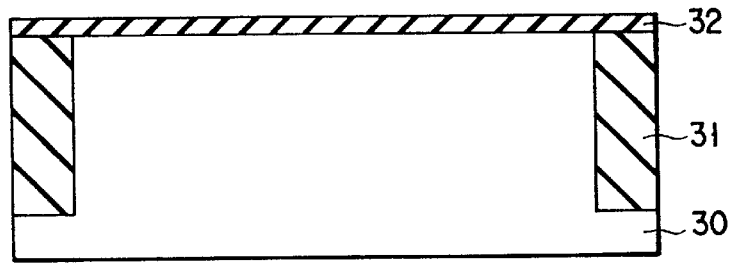
FIG. 21 is a cross sectional view showing a first step of a method of manufacturing a semiconductor device according to the second embodiment of the present invention.

As shown in FIG. 21, the element separation region 31 is formed within the silicon semiconductor substrate 30 by a burying oxidizing method, followed by applying an ion implantation for forming a well, a channel, etc. Then, a thermal oxidation is applied to the semiconductor substrate 30 under an oxidizing atmosphere of a high temperature so as to form the gate insulating film 32 consisting of silicon oxide on the semiconductor substrate 30.

Figure 22:
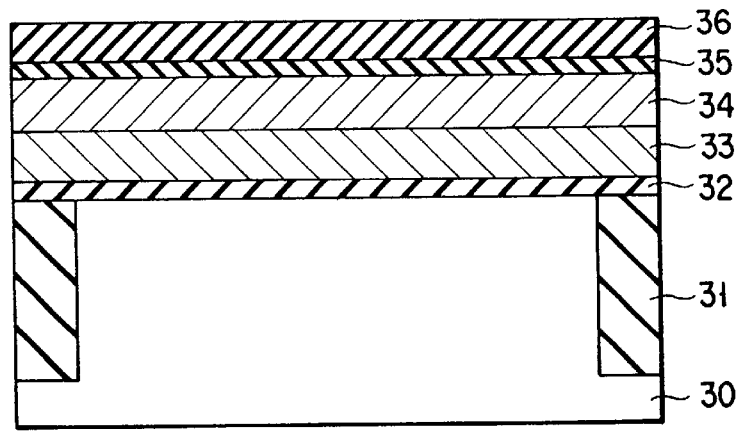
FIG. 22 is a cross sectional view showing a second step of a method of manufacturing a semiconductor device according to the second embodiment of the present invention.
Figure 23:
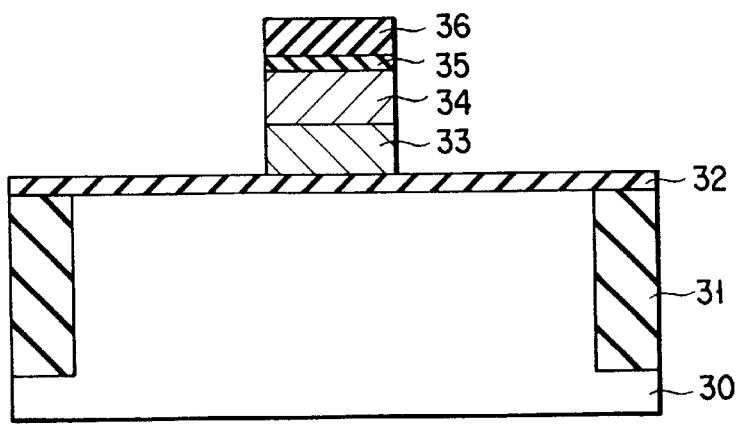
FIG. 23 is a cross sectional view showing a third step of a method of manufacturing a semiconductor device according to the second embodiment of the present invention.

After formation of the gate insulating film 32, a polysilicon layer 33 constituting the lowermost layer of the gate electrode of a stacked structure is formed by a CVD method on the gate insulating film 32, as shown in FIG. 22. Then, phosphorus ions are introduced into the polysilicon layer 33 by ion implantation at a dose of $5 \times 10^{15}$ cm$^{-2}$ and under an accelerating energy of 10 keV, followed by an annealing treatment under a nitrogen gas atmosphere at 850° C. for 30 minutes so as to diffuse the implanted phosphorus ions into the polysilicon layer 33. In this step, it is possible to selectively introduce, for example, phosphorus ions and boron ions by means of ion implantation into the nMOS transistor-forming region and the pMOS transistor-forming region, respectively, using a mask prepared by a lithography method.

In the next step, a metal layer, e.g., tungsten layer 34, is deposited in a thickness of 100 nm on the polysilicon layer 33, followed by depositing a silicon oxide layer 35 acting as a cap film on the tungsten layer 34 by a high frequency (RF) sputtering method under a non-oxidizing atmosphere of a low temperature. It should be noted that the surface of the tungsten layer 34 is physically covered with and pushed by the silicon oxide film 35. As a result, roughening of a surface morphology that accompanies the oxidation of the tungsten layer 34 does not take place during deposition of a silicon nitride film 36 on the silicon oxide film 35 in the subsequent step. Also, the RF sputtering treatment for depositing the silicon oxide film 35 is performed under a high vacuum within the process chamber, with the result that the tungsten layer 34 is not oxidized.

Further, the silicon nitride layer 36 acting as a cap film is deposited by a CVD method on the silicon oxide layer 35. Then, the stacked structure including the layers 33, 34, 35 and 36 is patterned to form a gate electrode, as shown FIG. 23.

Figure 24:
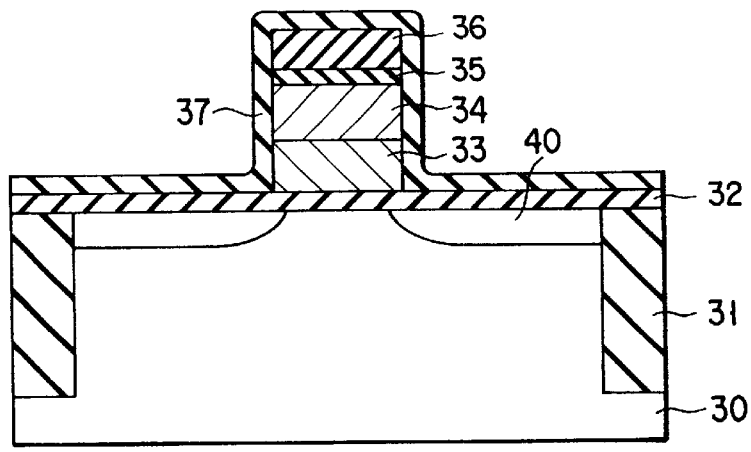
FIG. 24 is a cross sectional view showing a fourth step of a method of manufacturing a semiconductor device according to the second embodiment of the present invention.

In the next step, a silicon oxide film 37 is deposited by an RF sputtering method under a non-oxidizing atmosphere of a low temperature to cover the silicon nitride layer 36 included in the gate protective film, the side surfaces of the gate electrode and the surface of the semiconductor substrate 10, as shown in FIG. 24. The silicon oxide film 37 thus deposited serves to conceal defects such as pin holes present in the silicon nitride film 36 so as to prevent an oxidizing agent from intruding into a silicon nitride film 38 that is to be deposited in the subsequent step. Also, since the silicon oxide film 37 is deposited under a high vacuum, the tungsten layer 34 is not oxidized in spite of the presence of pin holes in the silicon nitride film 36.

Figure 25:
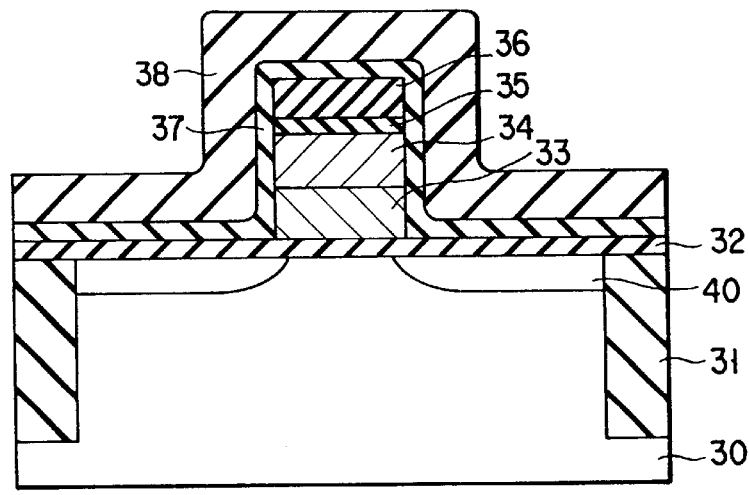
FIG. 25 is a cross sectional view showing a fifth step of a method of manufacturing a semiconductor device according to the second embodiment of the present invention.

Then, the n-extension 40 and the p-extension (not shown) of the source and drain regions are selectively formed by ion implantation in the nMOS and pMOS transistors, respectively, using a mask prepared by a lithography method. Further, by the known selective after-oxidation technology, the silicon oxide film 37 alone is selectively oxidized under an atmosphere containing water vapor and hydrogen without oxidizing a metal layer such as the tungsten layer 34. By this oxidation, the electric field applied to the gate insulating film at the edge of the gate electrode during operation of the transistor is prevented from being concentrated. At the same time, the density of the silicon oxide film 37 deposited by the RF sputtering method is further increased. Further, the silicon nitride film 38 is deposited in a thickness of 80 nm by a CVD method on the silicon oxide film 37, as shown in FIG. 25.

In the next step, the silicon nitride film 38 is anisotropically etched by a reactive ion etching (RIE) method without using a mask pattern of a resist film to leave the silicon nitride film 38 unremoved on the side surface of the gate electrode, as shown in FIG. 20, thereby forming the gate side wall film 39 consisting of the silicon oxide film 37 and the silicon nitride film 38. Further, the n$^+$-type diffusion layer 41 and the p$^+$-type diffusion layer (not shown) constituting the source and drain regions are formed in the nMOS and pMOS transistor regions, respectively, by means of ion implantation, using a mask prepared by a lithography method.

The gate electrode portion characterizing the semiconductor device of the second embodiment is prepared by the processes described above. Then, the ordinary process of manufacturing a MOS-FET is followed for manufacturing the semiconductor device according to the second embodiment of the present invention.

For example, the subsequent manufacturing process in the second embodiment of the present invention is as follows. In the first step, a resist pattern is selectively formed on the gate electrode alone as in the first embodiment, followed by etching the silicon oxide film 37 and the gate insulating film 32 positioned in the vicinity of the gate electrode and subsequently removing the resist pattern. Then, a titanium film is deposited in a thickness of 20 nm, followed by depositing a titanium nitride film in a thickness of 70 nm on the titanium film. Further, a lamp annealing is applied to the stacked structure consisting of the titanium film and the titanium nitride film at 650° C. for 30 seconds under a nitrogen gas atmosphere so as to carry out reaction between the silicon semiconductor substrate 30 and titanium to form a titanium silicide film. Then, the unreacted titanium and titanium nitride are selectively removed by using a mixed solution consisting of sulfuric acid and hydrogen peroxide solution. Further, a phase change is brought about in the titanium silicide film by a lamp annealing at 800° C. for 30 seconds so as to form a C54 phase of a low resistivity.

After formation of the C54 phase, an interlayer insulating film such as a BPSG film is deposited in a thickness of 700 nm, followed by forming a contact hole in the interlayer insulating film. Further, a conductive film is deposited on the resultant structure, followed by patterning the conductive film to form a wiring layer.

In the second embodiment, the tungsten layer 34 included in the gate electrode is covered with the silicon oxide films 35, 37 acting as a cap film and with the silicon oxide film 37 forming a gate side wall film. Therefore, even if defects such as pin holes are present in the silicon nitride films 36, 38 forming the cap film and the gate side wall film, a mixed solution of sulfuric acid and hydrogen peroxide solution does not intrude into the gate electrode in the step of selectively removing the unreacted titanium and titanium nitride. Naturally, the tungsten layer 34 included in the gate electrode is prevented from being dissolved in the mixed solution.

It should also be noted that the upper surface of the tungsten layer 34 is covered with the silicon oxide film 36 acting as a cap film. Thus, when the silicon nitride film 36 forming a cap film is deposited on the tungsten layer 34, the tungsten layer 34 is prevented from being oxidized by the oxidizing agent within the atmosphere. Naturally, the surface region of the tungsten layer 34 is prevented from the morphological deterioration.

Further, the side surface of the tungsten layer 34 included in the gate electrode is covered with the silicon oxide film 37, and the upper surface of the tungsten layer 34 is covered with the silicon oxide films 35 and 37. Therefore, when the silicon nitride film 38 forming a gate side wall film is deposited on the side surface of the gate electrode, the oxidizing agent within the atmosphere is prevented from intruding into the gate electrode through the defects such as pin holes of the silicon nitride film 36 used as a cap film. It follows that the tungsten layer 34 included in the gate electrode is prevented from being oxidized.

What should also be noted is that, in the step of forming a contact hole by self-alignment, the silicon nitride film 36 acting as a gate protective film (cap film) is formed on the gate electrode. Since the silicon nitride film 36 acts as an etching stopper on the gate electrode, the gate electrode is not corroded.

The silicon nitride film 36 can be formed by a single depositing operation. Alternatively, it is possible to repeat several times the silicon nitride deposition and interruption of the deposition such that the nitride film 36 is formed by several times of the silicon nitride deposition. In this case, even if pin holes are formed in the silicon nitride layer deposited in the previous depositing operation, these pin holes are closed by the silicon nitride layer deposited in the subsequent depositing operation. It follows that it is possible to prevent the pin holes from extending throughout the silicon nitride film 36 in its thickness direction. It is also possible to form the silicon nitride films 38 by several times of the silicon nitride deposition. In this case, the mixed solution consisting of sulfuric acid and a hydrogen peroxide solution is prevented from permeating through the silicon nitride film 36 or 38 to reach the gate electrode.

As described above, according to the second embodiment of the present invention, the mixed solution of sulfuric acid and hydrogen peroxide solution used in forming the silicide layer in the source and drain regions (salicide technology) is prevented from intruding into the gate electrode through the defects such as pin holes of the silicon nitride film used as a gate protective film (cap film and gate side wall film). As a result, it is possible to prevent the tungsten layer included in the gate electrode from being dissolved in the mixed solution. Similarly, in the resist removing step for removing the resist used in the patterning step, the removing solution for removing the resist is prevented from intruding into the gate electrode through the defects such as pin holes of the silicon nitride film used as a gate protective film (cap film and gate side wall film). It follows that the tungsten layer included in the gate electrode is prevented from being dissolved in the removing solution.

Also, the upper surface of the tungsten layer included in the gate electrode is covered with a silicon oxide film. Therefore, when a silicon nitride film used as a cap film is deposited on the tungsten layer, the tungsten layer is prevented from being oxidized by the oxidizing agent present in the atmosphere and, thus, the surface of the tungsten layer is prevented from the morphological deterioration.

Further, the side surface and the upper surface of the tungsten layer included in the gate electrode are covered with a silicon oxide film. Thus, in the step of forming a silicon nitride film used as a gate side wall film on the side surface of the gate electrode, the oxidizing agent within the atmosphere is prevented from intruding into the gate electrode through the defects such as pin holes of the silicon nitride film used as a cap film. Naturally, the tungsten layer included in the gate electrode is prevented from being oxidized.

In addition, in the second embodiment of the present invention, a silicon oxide film having a low dielectric constant is formed between the gate electrode and the silicon nitride film so as to suppress the parasitic capacitance, particularly, an overlap capacitance. Also, since the $n^+$-type diffusion layer forming an active region is covered with a silicon oxide film, the active region is prevented from being exposed directly to a plasma in the step of forming a gate side wall by applying a reactive ion etching to the silicon nitride film. As a result, it is possible to prevent impurities derived from the reactive ion etching from entering the active region. It is also possible to suppress damage done to the active region.

Incidentally, the second embodiment is directed to a gate electrode of a stacked structure consisting of a polysilicon layer and a tungsten layer. However, it is possible for the stacked structure to consist of a polysilicon layer and another metal layer.

In the second embodiment described above, the silicon oxide film is deposited by a high frequency (RF) sputtering method. However, the silicon oxide film can also be deposited by employing a low temperature method that does not bring about oxidation such as a CVD method under atmospheric pressure or a magnetron sputtering method. Further, a deposition method carried out under vacuum such as a plasma-induced CVD method can also be used for depositing the silicon oxide film.

The construction of a semiconductor device according to a third embodiment of the present invention will now be described. The following description is directed to an nMOS transistor. However, the technical idea of the third embodiment can also be applied to a CMOS transistor including a pMOS transistor.

Figure 26:
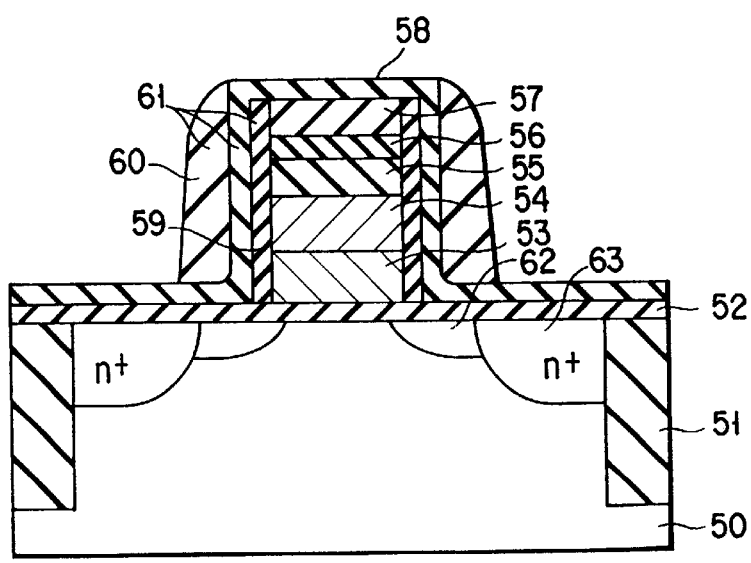
FIG. 26 is a cross sectional view showing a semiconductor device according to a third embodiment of the present invention.

FIG. 26 is a cross sectional view showing the construction of a semiconductor device according to the third embodiment of the present invention. As shown in the drawing, an element separation region 51 for separating element regions is formed in a semiconductor substrate 50. Also, a gate insulating film 52 consisting of silicon oxide ($SiO_2$) is formed on the semiconductor substrate 50.

A gate electrode consisting of a polysilicon layer 53 having a thickness of about 100 nm and a metal layer, e.g., a tungsten layer 54 having a thickness of about 100 nm is formed on the gate insulating film 52.

Further, a stacked structure acting as a cap film used as a gate protective film and consisting of a silicon nitride film 55 having a thickness of about 50 nm, a silicon oxide film 56 having a thickness of about 10 nm, a silicon nitride film 57 having a thickness of about 100 nm, and a silicon oxide film 58 having a thickness of about 10 nm is formed on the gate electrode.

Further, a silicon nitride 59 is formed to cover the side surfaces of the gate electrode, the silicon nitride film 55, the silicon oxide film 56 and the silicon nitride film 57. Still further, a silicon oxide film 58 and a silicon nitride film 60 are formed to cover the outer surface of the silicon nitride film 59. These silicon nitride film 59, silicon oxide film 58 and silicon nitride film 60 collectively constitute a gate side wall film 61.

An n-extension 62 and a p-extension (not shown) for the source and drain regions are selectively formed in the nMOS transistor and the pMOS transistor within the semiconductor substrate 50 on both edge portions of the gate electrode. Further, an $n^+$-type diffusion layer 63 and a $p^+$-type diffusion layer (not shown) are formed on the outside of the n-extension 62 and the p-extension so as to form a semiconductor device of the third embodiment.

The semiconductor device of the third embodiment is manufactured as follows. Specifically, FIGS. 26 to 31 are cross sectional views collectively the method of manufacturing the semiconductor device of the third embodiment.

Figure 27:
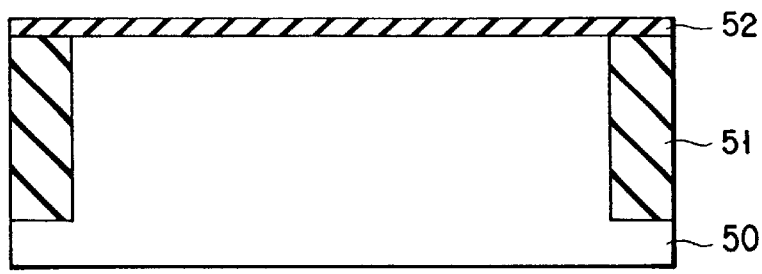
FIG. 27 is a cross sectional view showing a first step of a method of manufacturing a semiconductor device according to the third embodiment of the present invention.

As shown in FIG. 27, an element separation region 51 is formed by a burying oxidation method within a silicon semiconductor substrate 50, followed by applying an ion implantation to form a well region and a channel region. Then, a thermal oxidation is applied to the semiconductor substrate 50 under an oxidizing atmosphere of a high temperature so as to form the gate insulating film 52 consisting of silicon oxide.

Figure 28:
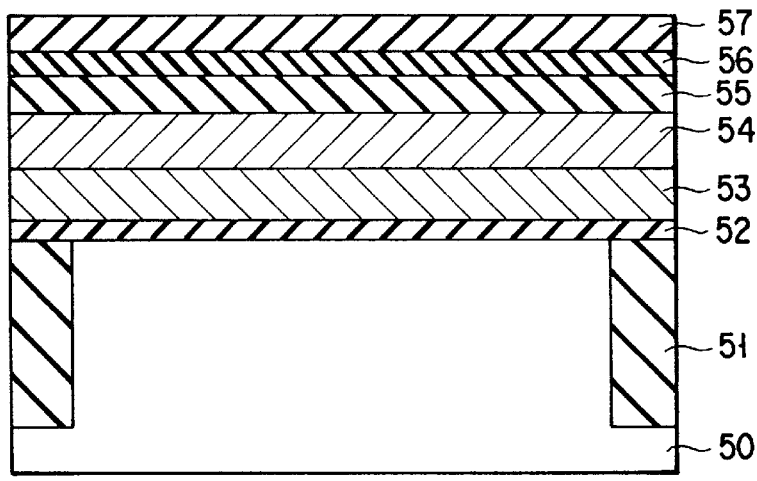
FIG. 28 is a cross sectional view showing a second step of a method of manufacturing a semiconductor device according to the third embodiment of the present invention.

In the next step, the polysilicon layer 53 forming the lowermost layer of the gate electrode is deposited in a thickness of 100 nm on the gate insulating film 52 by a CVD method, as shown in FIG. 28. Then, the polysilicon layer 33 is doped with phosphorus at a dose of $5 \times 10^{15}$ $cm^{-2}$ by means of ion implantation performed under an accelerating energy of 10 keV, followed by annealing at 850° C. for 30 minutes under a nitrogen gas atmosphere so as to diffuse the implanted phosphorus into the polysilicon layer 53. In this step, it is possible to introduce selectively phosphorus and boron into an nMOS transistor-forming region and a pMOS transistor-forming region, respectively, by means of ion implantation using a mask prepared by lithography method.

Figure 29:
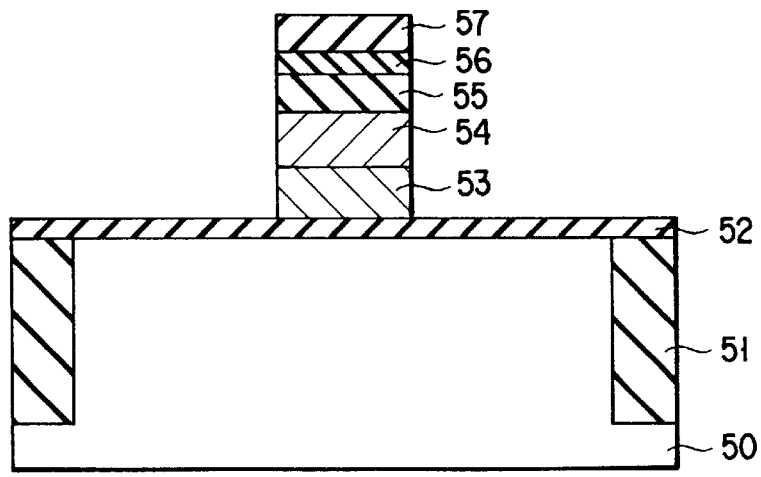
FIG. 29 is a cross sectional view showing a third step of a method of manufacturing a semiconductor device according to the third embodiment of the present invention.

In the next step, a metal layer, e.g., a tungsten layer 54 is deposited in a thickness of 100 nm on the polysilicon layer 53 by a sputtering method. Further, the silicon nitride film 55 having a thickness of 50 nm, the silicon oxide film 55 having a thickness of 10 nm, and the silicon nitride film 57 having a thickness of 100 nm, which collectively form a cap film, are successively deposited by a CVD method on the tungsten layer 54. Further, the stacked structure constituting the cap film and the stacked structure constituting the gate electrode are patterned by a lithography method to form the gate electrode covered with the cap film, as shown in FIG. 29.

Figure 30:
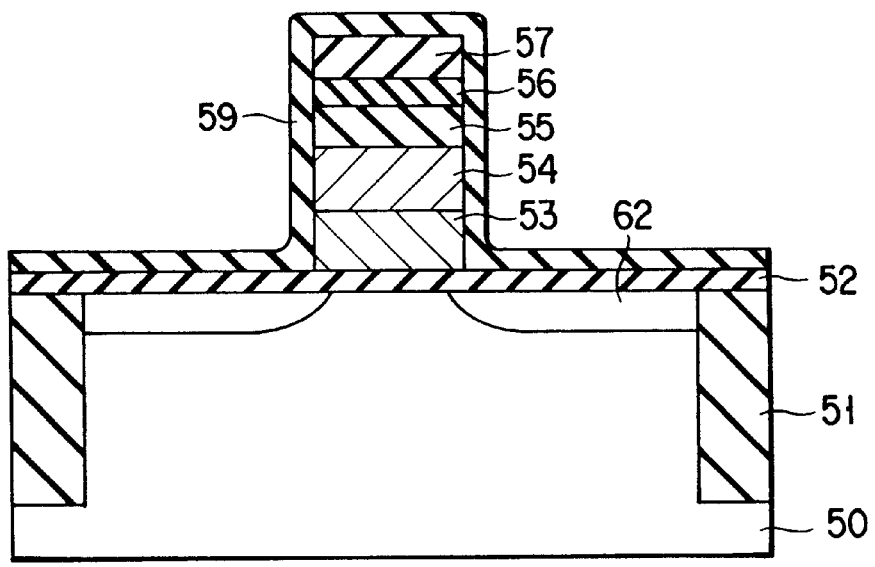
FIG. 30 is a cross sectional view showing a fourth step of a method of manufacturing a semiconductor device according to the third embodiment of the present invention.
Figure 31:
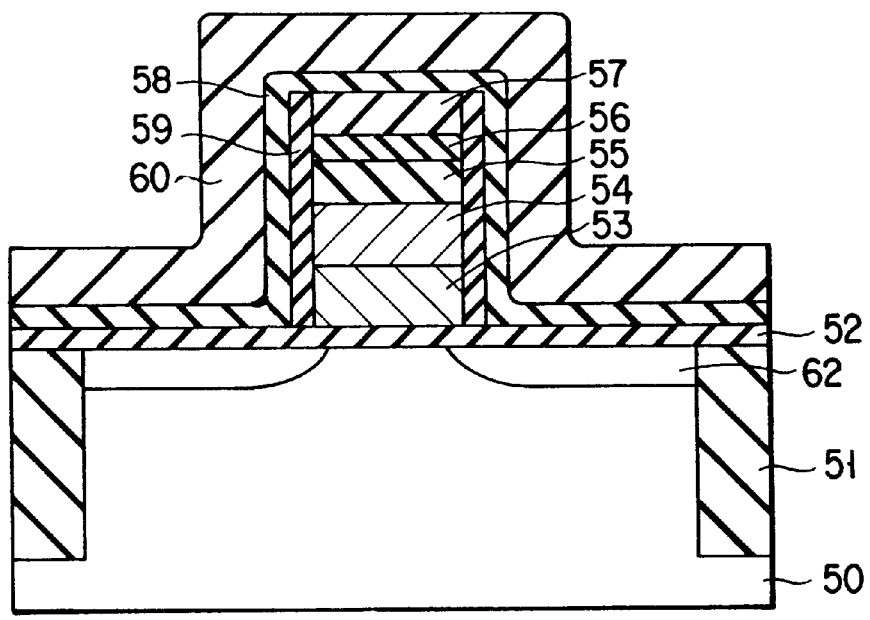
FIG. 31 is a cross sectional view showing a fifth step of a method of manufacturing a semiconductor device according to the third embodiment of the present invention.

Further, the silicon nitride film 59 is deposited by a CVD method in a thickness of 10 nm, as shown in FIG. 30, followed by anisotropically etching the silicon nitride film 59 by a reactive ion etching (RIE) method to allow the silicon nitride film 59 to remain on the side wall of the gate electrode, as shown in FIG. 31. Further, an n-extension 62 and a p-extension (not shown) for the source and drain regions are selectively formed by ion implantation in the nMOS transistor and the pMOS transistor.

In the next step, the silicon oxide film 58 is deposited by a CVD method in a thickness of 10 nm, followed by depositing the silicon nitride film 60 in a thickness of 80 nm. Further, the silicon nitride film 60 is anisotropically etched by a reactive ion etching (RIE) method without using a mask pattern of a resist film to allow the silicon nitride film 60 to remain on the side surface of the gate electrode, as shown FIG. 26. As a result, formed is the gate side wall film 61 consisting of the silicon nitride film 59, the silicon oxide film 58 and the silicon nitride 60. Further, an $n^+$-type diffusion layer 63 and a $p^+$-type diffusion layer (not shown) forming the source and drain regions are selectively formed by ion implantation using a mask prepared by a lithography method in the nMOS transistor and the pMOS transistor, respectively.

Preparation of the gate electrode portion characterizing the third embodiment of the present invention is finished by the steps described above. Then, the ordinary manufacturing process of MOS-FET is followed for manufacturing a desired semiconductor device.

For example, the subsequent manufacturing process in the third embodiment of the present invention is as follows. In the first step, a resist pattern is selectively formed on the gate electrode alone as in the second embodiment, followed by etching the silicon oxide film 58 and the gate insulating film 52 positioned in the vicinity of the gate electrode and subsequently removing the resist pattern. Then, a titanium film is deposited in a thickness of 20 nm, followed by depositing a titanium nitride film in a thickness of 70 nm on the titanium film. Further, a lamp annealing is applied to the stacked structure consisting of the titanium film and the titanium nitride film at 650° C. for 30 seconds under a nitrogen gas atmosphere so as to carry out reaction between the silicon semiconductor substrate 50 and titanium to form a titanium silicide film. Then, the unreacted titanium and titanium nitride are selectively removed by using a mixed solution consisting of sulfuric acid and hydrogen peroxide solution. Further, a phase change is brought about in the titanium silicide film by a lamp annealing at 800° C. for 30 seconds so as to form a C54 phase of a low resistivity.

After formation of the C54 phase, an interlayer insulating film such as a BPSG film is deposited in a thickness of 700 nm, followed by forming a contact hole in the interlayer insulating film. Further, a conductive film is deposited on the resultant structure, followed by patterning the conductive film to form a wiring layer.

In the third embodiment, the tungsten layer 54 included in the gate electrode is covered with the silicon oxide films 56, 58 acting as a cap film and with the silicon oxide film 58 forming a gate side wall film. Therefore, even if defects such as pin holes are present in the silicon nitride films 55, 57 and 60 forming the cap film and the gate side wall film, a mixed solution of sulfuric acid and hydrogen peroxide solution does not intrude into the gate electrode in the step of selectively removing the unreacted titanium and titanium nitride. Naturally, the tungsten layer 54 included in the gate electrode is prevented from being dissolved in the mixed solution.

It should also be noted that the side surface of the tungsten layer 54 is covered with the silicon oxide film 58. Also, the upper surface of the tungsten layer 54 is covered with the silicon oxide films 56, 58. Thus, when the silicon nitride film 60 forming a gate side wall film is deposited on the side surface of the gate electrode, the oxidizing agent within the atmosphere is prevented from intruding into the gate electrode through the defects such as pin holes of the silicon nitride film 55 and the silicon nitride film 57 used as a cap film. Naturally, the tungsten layer 54 included in the gate electrode is prevented from being oxidized by the oxidizing agent within the atmosphere.

What should also be noted is that, in the step of forming a contact hole by self-alignment, the silicon nitride film 57 acting as a gate protective film (cap film) is formed on the gate electrode. Since the silicon nitride film 57 acts as an etching stopper on the gate electrode, the gate electrode is not corroded.

The silicon nitride film 55 can be formed by a single depositing operation. Alternatively, it is possible to repeat several times the silicon nitride deposition and interruption of the deposition such that the nitride film 55 is formed by several times of the silicon nitride deposition. In this case, even if pin holes are formed in the silicon nitride layer deposited in the previous depositing operation, these pin holes are closed by the silicon nitride layer deposited in the subsequent depositing operation. It follows that it is possible to prevent the pin holes from extending throughout the silicon nitride film 55 in its thickness direction. It is also possible to form each of the silicon nitride films 57, 59 and 60 by several times of the silicon nitride deposition. In this case, the mixed solution consisting of sulfuric acid and a hydrogen peroxide solution is prevented from permeating through the silicon nitride films 55, 57, 59 or 60 to reach the gate electrode.

As described above, according to the third embodiment of the present invention, the mixed solution of sulfuric acid and hydrogen peroxide solution used in forming the silicide layer in the source and drain regions (salicide technology) is prevented from intruding into the gate electrode through the defects such as pin holes of the silicon nitride film used as a gate protective film (cap film and gate side wall film). As a result, it is possible to prevent the tungsten layer included in the gate electrode from being dissolved in the mixed solution. Similarly, in the resist removing step for removing the resist used in the patterning step, the removing solution for removing the resist is prevented from intruding into the gate electrode through the defects such as pin holes of the silicon nitride film used as a gate protective film (cap film and gate side wall film). It follows that the tungsten layer included in the gate electrode is prevented from being dissolved in the removing solution.

Also, the upper surface of the tungsten layer included in the gate electrode is covered with a silicon oxide film. Therefore, when a silicon nitride film used as a gate side wall film is deposited on the tungsten layer, the oxidizing agent within the atmosphere is prevented from intruding into the gate electrode through the defects such as pin holes of the silicon nitride film used as a cap film. Naturally, the tungsten layer included in the gate electrode is prevented from being oxidized.

Further, in the third embodiment of the present invention, since the n$^+$-type diffusion layer forming an active region is covered with a silicon oxide film, the active region is prevented from being exposed directly to a plasma in the step of forming a gate side wall by applying a reactive ion etching to the silicon nitride film. As a result, it is possible to prevent impurities derived from the reactive ion etching from entering the active region. It is also possible to suppress damage done to the active region.

In the third embodiment described above, the gate electrode is of a stacked structure consisting of a polysilicon layer and a tungsten layer. However, it is also possible for the stacked structure to consist of a polysilicon layer and another metal layer.

As described above, the present invention provides a semiconductor device in which a gate electrode of a stacked structure consisting of a polysilicon layer and a metal layer is not damaged or deteriorated, and a method of manufacturing the same.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a gate electrode including a stacked structure of a polysilicon layer and a metal layer, said polysilicon layer and said metal layer each having side walls;
   a first silicon nitride film formed on an upper surface of said gate electrode, said first silicon nitride film having side walls;
   first side wall insulating films covering the side walls of said polysilicon layer and said metal layer included in said gate electrode and covering the side walls of said first silicon nitride film, said first side wail insulating films each including a silicon nitride film;
   a second silicon nitride film covering said first sidewall insulating films and covering a top surface of said first silicon nitride film;
   a second side wall insulating film covering a side portion of said second silicon nitride film; and
   an interlayer insulating film covering said second side wall insulating film and including a portion located beneath a lower surface of said second side wall insulating film.

2. A semiconductor device according to claim 1, wherein said second side wall insulating film includes one of a silicon nitride film and a silicon oxide film.

3. A semiconductor device according to claim 1, wherein said gate electrode is formed on a channel region in a semiconductor layer, said semiconductor layer containing a source diffusion layer and a drain diffusion layer which are arranged in such a manner as to sandwich said channel region.

4. A semiconductor device comprising:
   a stacked structure including a polysilicon layer, a metal layer and a first silicon nitride film, said polysilicon layer and said metal layer forming a gate electrode, said first silicon nitride film being located on said gate electrode, and said stacked structure having side walls;
   first side wall insulating films covering the side walls of said stacked structure, said first side wall insulating films each including a silicon nitride film;

a second silicon nitride film covering a too surface of said stacked structure and covering said first side wail insulating films;

a second side wall insulating film covering a side portion of said second silicon nitride film; and an interlayer insulating film covering said second side wall insulating film and including a portion located beneath a lower surface of said second side wall insulating film.

5. A semiconductor device according to claim 4, wherein said second side wall insulating film includes one of a silicon nitride film and a silicon oxide film.

6. A semiconductor device according to claim 4, wherein said gate electrode is formed on a channel region in a semiconductor layer, said semiconductor layer containing a source diffusion layer and a drain diffusion layer which are arranged in such a manner as to sandwich said channel region.

7. A semiconductor device comprising:

a gate electrode having side walls, said gate electrode comprising a metal element;

a first silicon nitride film formed on an upper surface of said gate electrode, said first silicon nitride film having side walls;

first side wall insulating films covering the side walls of said gate electrode and covering the side walls of said first silicon nitride film, said first side wall insulating films each including a silicon nitride film;

a second silicon nitride film covering said first side wail insulating films and covering a top surface of said first silicon nitrite film;

a second side wall insulating film covering a side portion of said second silicon nitride film; and an interlayer insulating film covering said second side wall insulating film and including a portion located beneath a lower surface of said second side wall insulating film.

8. A semiconductor device according to claim 7, wherein said second side wall insulating film includes one of a silicon nitride film and a silicon oxide film.

9. A semiconductor device according to claim 7, wherein said gate electrode is formed on a channel region in a semiconductor layer, said semiconductor layer containing a source diffusion layer and a drain diffusion layer which are arranged in such a manner as to sandwich said channel region.

10. A semiconductor device comprising;

a stacked structure including a gate electrode and a first silicon nitride film, said first silicon nitride film being located on said gate electrode, said stacked structure having side walls, said gate electrode comprising a metal element;

first side wall insulating films covering the side walls of said stacked structure, said first side wall insulating films each including a silicon nitride film;

a second silicon nitride film covering a top surface of said stacked structure and said first side wall insulating films;

a second side wall insulating film covering a side portion of said second silicon nitride film; and an interlayer insulating film covering said second side wall insulating film and including a portion located beneath a lower surface of said second side wall insulating film.

11. A semiconductor device according to claim 10, wherein said second side wall insulating film includes one of a silicon nitride film and a silicon oxide film.

12. A semiconductor device according to claim 10, wherein said gate electrode is formed on a channel region in a semiconductor layer, said semiconductor layer containing a source diffusion layer and a drain diffusion layer which are arranged in such a manner as to sandwich said channel region.

* * * * *